June 20, 1961 J. W. LATHROP 2,989,669

MINIATURE HERMETICALLY SEALED SEMICONDUCTOR CONSTRUCTION

Filed Jan. 27, 1959

INVENTOR

JAY W. LATHROP

BY S. J. Rotondi, A. J. Dupont, F. E. McGee & N. Cass

United States Patent Office 2,989,669

Patented June 20, 1961

2,989,669

MINIATURE HERMETICALLY SEALED SEMICONDUCTOR CONSTRUCTION

Jay W. Lathrop, Dallas, Tex., assignor to the United States of America as represented by the Secretary of the Army Filed Jan. 27, 1959, Ser. No. 789,464

6 Claims. (Cl. 317—234)

(Granted under Title 35, U.S. Code (1952), sec. 266)

The invention described herein may be manufactured and used by or for the Government for governmental purposes without the payment to me of any royalty thereon.

This invention relates generally to transistor constructions, and more particularly to a miniaturized hermetically-sealed transistor construction in which the transistor is incorporated as an integral part of a printed circuit plate.

Because of the increased complexities in modern day electronic devices, such as computers, miniaturization has become increasingly important. This is particularly true where complex electronic circuitry is to be incorporated in guided missiles or space satellites, because of the severe limitations on size and weight.

Miniaturization techniques have been successfully applied to circuit wiring and to passive electronic components by means of such techniques as printed wiring and printed components, as may be seen used today on conventional forms of printed circuit plates. A limiting factor, however, in further miniaturizing over-all circuit volume has been the relatively large size of transistors and other semiconductor components. For example, the smallest encased hearing aid type transistor occupies a volume of $1700\times10^{-6}$ in.$^3$ and if lead connections are considered this is increased still further. Compared to a 10,000 ohm printed resistor which can be made with a volume of $0.8\times10^{-6}$ in.$^3$ and a 0.01 microfarad barium titanate capacitor which can be made with a volume of $60\times10^{-6}$ in.$^3$, the size of the transistor seems truly gigantic.

It is an object of the present invention therefore to provide an improved construction whereby semiconductor elements, such as transistors and diodes, are greatly miniaturized and are incorporated with other printed components as integral parts of a printed circuit plate.

It is another object to provide a method of incorporating a semiconductor as an integral part of a printed circuit plate such that the semiconductor is hermetically sealed therein.

It is a further object of the invention to provide, in accordance with any or all of the above objects, a construction in which an uncased semiconductor element is incorporated as an integral part of a printed circuit plate so that only the semiconductor element is hermetically sealed without the need to seal the entire printed circuit plate.

In a typical embodiment of the invention, the above objects are accomplished by a novel method of incorporating the transistor as an integral part of a printed circuit plate, whereby both the necessary lead connections and hermetic sealing are achieved in an amazingly simple manner to provide an over-all construction which has never before been achieved.

The specific nature of the invention, as well as othei objects, uses and advantages thereof, will clearly appear from the following description and from the accompanying drawing, in which.

The first step in miniaturizing a semiconductor element, is to remove the protective casing and the associated lead wires from a conventional cased transistor. The actual uncased transistor is really much smaller than when cased, since the necessity for providing hermetic sealing and suitable lead wires requires a considerable volume which necessarily increases the over-all size of the semiconductor element. This can be seen from the fact that the volume of an uncased transistor is approximately $\frac{1}{100}$ of its volume when cased. Attempts to incorporate the uncased transistor in printed circuit plates, however, have led to considerable difficulty, both in the methods for doing so and in the type of final construction achieved. It has been found difficult to apply the necessary connecting leads to the transistor, and even more difficult to hermetically seal the transistor without having to seal the entire printed circuit plate. To best illustrate how the present invention solves these problems, the structure of the individual elements of the construction and the method of assembling them will be described.

Figure 2:
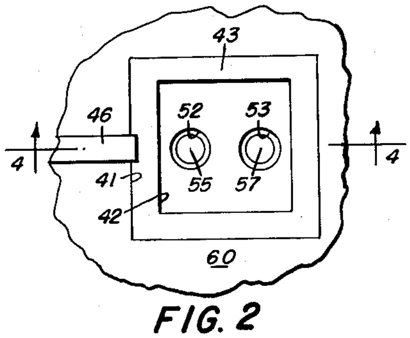
FIG. 2 is a top view of the portion of the printed circuit plate in which the transistor is to be incorporated.
Figure 3:
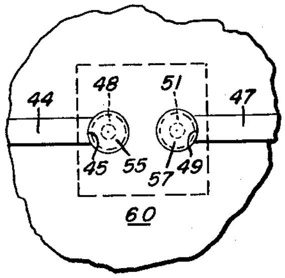
FIG. 3 is a bottom view of the portion of the printed circuit plate of FIG. 2.
Figure 4:
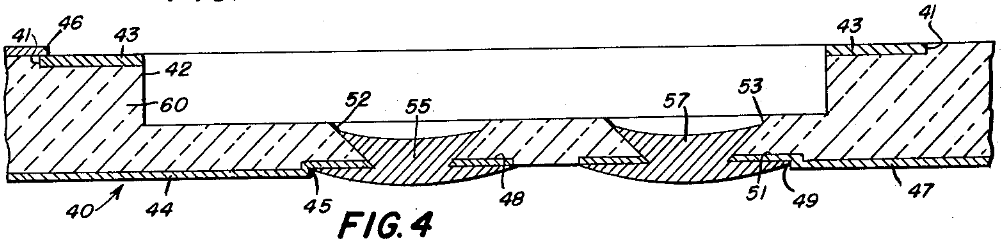
FIG. 4 is a cross-sectional side view of the printed circuit plate portion of FIGS. 2 and 3 taken along 4—4 of FIG. 2.
Figure 5:
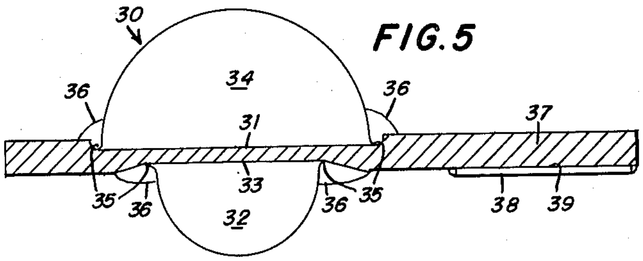
FIG. 5 is a side view of the uncased transistor which is to be incorporated in the portion of the printed circuit plate shown in FIGS. 2–4.
Figure 6:
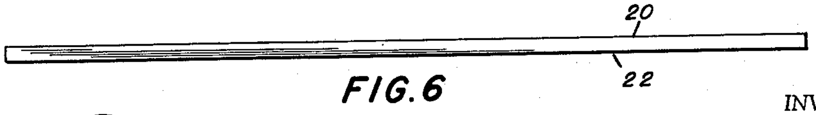
FIG. 6 is a side view of the cover plate which hermetically seals the transistor and also, makes contact between the transistor collector and other portions of the printed circuit plate.

FIG. 5 shows a conventional type of germanium alloy transistor 30 with its case and lead wires removed. The transistor 30 has a germanium body 37. A hemispherical indium emitter 32 and a flat ohmic base connection 38 is formed on one side of the germanium body 37, and a hemisperical indium collector 34 is formed on the other side of the germanium body 37 opposite the emitter 32. The grooves 35 around the emitter 32 and collector 34 are made by electrolytically etching the device by well known means. This is standard semiconductor practice, following alloying, to remove any material shorting the junctions and also to give a low surface recombination velocity. The grooves 35 are filled with a protective plastic 36. An alloy indium junction 31 is formed between the collector 34 and the germanium body 37, an alloy indium junction 33 is formed between the emitter 32 and the body 37, an an alloy gold junction 39 is formed between the ohmic base connection 38 and the body 37, all in accordance with well known practice. Prior to incorporation in the printed circuit plate, the transistor 30 is coated with a protective photosensitive lacquer and allowed to dry. Also, the base connection 38 is coated with indium to insure good wettability during subsequent steps, In FIGS. 2–4 a portion of a printed circuit plate 40 is shown, the other portions of which (not shown) may have printed wiring and other printed components thereon. The printed circuit plate has a ceramic body 60 which is machined to give a level rectangular depression 42 approximately 2 to 3 times as deep as the thickness of the germanium body 37 of the transistor 30 (FIG. 5) and slightly larger in area. Two tapered holes 52 and 53 adapted to receive the emitter 32 and base connection 38, respectively, are made in the ceramic 60 within the depression 42. This may be accomplished by sandblasting in a conventional manner. The bottom and top sides of the ceramic 60 are now metalized as follows. The bottom side of the ceramic 60 is metalized in shallow annular depressions 45 and 49 to form metalized areas 48 and 51 surrounding the holes 52 and 53, respectively. The bottom side of the ceramic 60 is also metalized to form leads 44 and 47 connecting the metalized areas 48 and 51 to other components of the printed circuit plate. The top side of the ceramic 60 is metalized in a shallow annular rectangular depression 41 to form a metalized area 43 surrounding the main rectangular depression 42 and a metalized lead 46 is formed on the top of the ceramic 60 to connect the annular rectangular depression 41 with other portions of the printed circuit plate.

The process of metalizing the ceramic may essentially be that given by Nolte and Spurck in Television Engineering, page 14, November 1950, and involves firing coatings of molybdenum and manganese at 1350° C. in wet hydrogen. The moly-manganese mixture forms a chemical bond to the ceramic under these conditions, insuring a true hermetic seal. Nickel oxide is then coated over this metalized surface and reduced to give a layer of nickel. In order to facilitate wetting of the metal surfaces, a layer of gold is deposited over the metalized areas by immersing the ceramic 60 in a gold displacement bath.

The annular rectangular metalized area 43 is now coated with a low temperature indium solder such as indium-tin having a melting point of about 117° C. A high temperature indium solder such as indium-silver having a melting point of about 230° C. is then applied to fill the lower portions of holes 52 and 53 while at the same time flowing to the metalized areas 48 and 51 on the bottom side of the ceramic 60. The resulting indium-silver is thus formed in holes 52 and 53 as shown by 55 and 57, respectively, providing a hermetic seal therefor. The indium-silver solder shown at 55 and 57 has a high melting point so that it will not be disturbed during subsequent operations.

Figure 7:
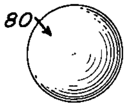
FIG. 7 is a view of the indium ball used in incorporating the transistor in the printed circuit plate.

A ball of indium 80, shown in FIG. 7, is now placed in the hole 53, which is to receive the indium coated ohmic base connection 38 of the transistor 30. The transistor 30, which has been coated with a protective photosensitive lacquer, is then inserted into the depression 42 such that the hole 52 of the ceramic 60 receives the indium emitter 32, while the ohmic base connection 38 contacts the indium ball 80 in hole 53. The tapered holes 52 and 53 are smaller than the indium emitter 32 and the indium ball 80 so that the transistor 30 does not lie flat in the depression 42. The ceramic 60 and the transistor 30 are now raised in temperature above the melting point of indium (about 155°) and pressure is applied to the top side of the germanium body 37 by any suitable means (not shown). This forces the indium emitter 32 and the indium ball 80 into holes 52 and 53, respectively, while at the same time causing the indium ball 80 to wet the ohmic base connection 38. The emitter 32 thus becomes effectively soldered to the indium-silver solder 55 while the ohmic base connection 38 becomes effectively connected to the indium-silver solder 57.

Figure 1:
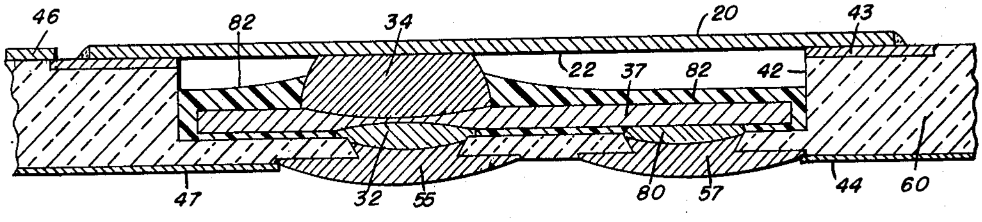
FIG. 1 is a sectional view of an uncased hermetically sealed transistor incorporated as an integral part of a printed circuit plate in accordance with the invention.

Referring now to the completed construction shown in FIG. 1, an epoxy 82 is now placed around the transistor in the depression 42, filling the space between the germanium body 37 and the ceramic 60 and also covering the exposed semiconductor surfaces, except for the raised indium collector 34. After the epoxy has set, part of the top of the indium collector 34 is removed.

A metal plate 20 shown in FIG. 1, having its bottom side 22 coated with low temperature indium-tin solder, is now placed over the top side of the ceramic 60 covering the depression 42 and heat and pressure are applied such that the cover plate 20 becomes effectively soldered to the metalized area 43 on the top of the ceramic 60 and also becomes soldered to the indium collector 34. The resulting construction, shown in FIG. 1, thus hermetically seals the transistor 30 and, in addition, compactly incorporates the transistor as an integral part of the printed circuit plate 40. The final step of encapsulating the transistor 30 with the cover plate 20 is preferably performed in a dry inert atmosphere so as to prevent any possibility of deterioration of the transistor. The metalized leads 46, 44, and 47 which are respectively connected to the collector, base and emitter of the transistor permit the transistor to be connected to other components (not shown) which may be printed on the ceramic 60.

In a specific embodiment of the invention, a conventional transistor has been incorporated in a printed circuit board only .02 inch thick, and after exposure to ammonium vapor for 30 minutes and to an atmosphere of 95% humidity and 71° C. for a period of 16 hours, no change in transistor characteristics was produced.

It will be apparent that the embodiments shown are only exemplary and that various modifications can be made in construction and arrangement within the scope of the invention as defined in the appended claims.

I claim as my invention:

1. In combination with a printed circuit plate, an uncased semiconductor incorporated as an integral part of said plate so that said semiconductor is hermetically sealed therein, said semiconductor having a raised contact on its top side and a second contact on its bottom side, said plate having a depression on its top side adapted to receive said semiconductor, said plate having a hole within said depression, the second contact of said semiconductor being opposite said hole, a metalized area around the periphery of said hole on the bottom side of said plate, said metalized area being soldered to said contact, so that said semiconductor is hermetically sealed at its bottom side, a second metalized area around the periphery of said depression on the top side of said plate, a cover plate completely covering said depression and soldered to said second metalized area and said raised contact so that said semiconductor is hermetically sealed at its top side, and metalized leads on said printed circuit plate connecting said metalized areas to other portions of said printed circuit plate.

2. The invention in accordance with claim 1 wherein an epoxy is additionally provided around said semiconductor in said depression covering the exposed semiconductor surfaces.

3. The invention in accordance with claim 2 wherein a dry, inert atmosphere fills the remaining volume within said depression.

4. In combination with a printed circuit plate, an uncased junction transistor incorporated as an integral part of said plate so that said transistor is hermetically sealed therein, said transistor having a raised contact on its top side and two contacts on its bottom side, said plate having a depression on its top side adapted to receive said transistor, said plate having first and second holes within said depression, one hole being opposite each of the two contacts on the bottom side of said transistor, first and second metalized areas on the bottom side of said plate around the peripheries of said first and second holes respectively, each of said first and second metalized areas being soldered to one of said two contacts so that said transistor is hermetically sealed at its bottom side, a third metalized area around the periphery of said depression on the top side of said plate, a cover plate completely covering said depression and soldered to said third metalized area and said raised contact so that said transistor is hermetically sealed at its top side, and metalized leads on said printed circuit plate connecting said metalized areas to other portions of said printed circuit plate.

5. The invention in accordance with claim 4 wherein an epoxy is additionally provided around said transistor in said depression covering the exposed transistor surfaces.

6. The invention in accordance with claim 5 wherein a dry inert atmosphere fills the remaining volume within said depression.

References Cited in the file of this patent

UNITED STATES PATENTS

| | | |
|---|---|---|
| 2,740,075 | Walker et al. | Mar. 27, 1956 |
| 2,813,326 | Liebowitz | Nov. 19, 1957 |
| 2,836,878 | Shepard | June 3, 1958 |
| 2,879,458 | Schubert | Mar. 24, 1959 |